US006579625B1

(12) United States Patent
Engel et al.

(10) Patent No.: US 6,579,625 B1
(45) Date of Patent: Jun. 17, 2003

(54) MAGNETOELECTRONICS ELEMENT HAVING A MAGNETIC LAYER FORMED OF MULTIPLE SUB-ELEMENT LAYERS

(75) Inventors: Bradley N. Engel, Chandler, AZ (US); Nicholas D. Rizzo, Gilbert, AZ (US); Jason A. Janesky, Mesa, AZ (US); Saied Tehrani, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 266 days.

(21) Appl. No.: 09/695,467

(22) Filed: Oct. 24, 2000

(51) Int. Cl.[7] .............................. G11B 5/127; G11B 5/39
(52) U.S. Cl. ..................... 428/611; 428/636; 428/78; 428/212; 428/220; 428/409; 428/692; 365/158; 365/173; 365/225.5
(58) Field of Search .................. 428/692, 192, 428/213, 220, 900, 78, 77, 611, 636, 212, 409; 365/158, 171, 173, 225.5

(56) References Cited

U.S. PATENT DOCUMENTS

| 5,587,943 | A | * | 12/1996 | Torok et al. ................ 365/158 |
| 5,608,593 | A | | 3/1997 | Kim et al. |
| 5,732,016 | A | * | 3/1998 | Chen et al. ................. 365/158 |
| 5,757,695 | A | * | 5/1998 | Shi et al. ..................... 365/158 |
| 6,111,784 | A | * | 8/2000 | Nishimura ................... 365/173 |
| 6,134,139 | A | * | 10/2000 | Bhattacharyya et al. .... 365/171 |
| 6,238,531 | B1 | * | 5/2001 | Pinarbasi ................ 204/192.11 |
| 2002/0135952 | A1 | * | 9/2002 | Gill ......................... 360/324.11 |

FOREIGN PATENT DOCUMENTS

| JP | 58100474 | 6/1983 |
| JP | 08203032 | 8/1996 |
| JP | 11126933 | 5/1999 |

OTHER PUBLICATIONS

Smith, D.J. et al., "Interlayer Coupling Within Individual Submicron Magnetic Elements," J. of Appl. Physics, 2000 American Inst. of Physics, vol. 87, No. 10, May 15, 2000, pp. 7400–7404.

Daughton, J.M. et al., "Applications of Spin Dependent Transport Materials," J. Phys. D. Appl. Physics, vol. 32, No. 22, pp. R169–R177.

* cited by examiner

Primary Examiner—Paul Thibodeau
Assistant Examiner—Kevin M. Bernatz
(74) Attorney, Agent, or Firm—William E. Koch

(57) ABSTRACT

A magnetic layer (46) of a magnetoelectronics element (40) is provided that has a first sub-element layer (48) and a second sub-element layer (50). The first sub-element layer (48) is configured to have a first area and the second sub-element layer (50) is configured to have a second area that is less than the first area.

18 Claims, 3 Drawing Sheets

US 6,579,625 B1

MAGNETOELECTRONICS ELEMENT HAVING A MAGNETIC LAYER FORMED OF MULTIPLE SUB-ELEMENT LAYERS

FIELD OF THE INVENTION

The present invention generally relates to a magnetoelectronics, and more particularly to a magnetoelectronics element.

BACKGROUND OF THE INVENTION

Magnetoelectronics, spin electronics and spintronics are synonymous terms for the use of effects predominantly caused by electron spin. Magnetoelectronics is used in numerous information devices, and provides non-volatile, reliable, radiation resistant, and high-density data storage and retrieval. The numerous magnetoelectronics information devices include, but are not limited to, magnetic random access memory (MPAM), magnetic sensors and read/write heads for disk drives.

Generally, a magnetoelectronics information device is constructed with magnetoelectronics elements (e.g., giant magneto resistance (GMR) elements or tunneling magneto resistance (TMR) elements). Efforts are continually made to reduce the size of magnetoelectronics elements in order to increase package density. While magnetoelectronics elements tend to operate effectively and efficiently as size is decreased, some problems arise with size reduction.

Without intending to be bound by theory, as the volume of a magnetoelectronics element is reduced, the energy barrier to the element switching approaches the thermal energy, and data retention is lost. This problem may be addressed with the maintenance of a substantially constant element volume through increased element thickness and lateral dimension reduction. However, there are factors that limit element thickness.

For a given lateral size of an element, there is an element thickness above which the net magnetization is decreased or completely lost due to formation of a flux closing configuration or magnetic vortex having no net moment. (See, R. P. Cowburn et al., *Physical Review Letters*, Volume 83, Number 5, pages 1042–1045, Aug. 2, 1999). This magnetization loss is typically undesirable in magnetoelectronics elements, as proper device operation usually relies upon uniform uniaxial magnetization. Also, relatively high magnetic fields are needed to annihilate magnetic vortices.

In addition to magnetic vortex formation, the element thickness affects the switching behavior of the element. This influence of the elements geometrical shape on element switching behavior is due in part to the demagnetization field effect (i.e., the tendency for electron spins to align parallel to a boundary or edge of an element). As the thickness of the element is increased, the demagnetization field effect increases and domain nucleation has a greater negative affect on the switching behavior. Specifically, domain nucleation undesirably encourages spin reversal when an external field is applied to the element for switching. This reversal does not involve the entire bit volume, thereby reducing the energy barrier to switching. Preferably, the switching behavior of the element is a substantially coherent rotation of all electron spins with minimal nucleation allowing the full volume to participate.

Accordingly, it is desirable to reduce the size of magnetoelectronics elements while maintaining a sufficient energy barrier for data retention. In addition, it is desirable to minimize magnetic vortex formation and domain nucleation in magnetoelectronics elements. Furthermore, other desirable features and characteristics of the present invention will become apparent from the subsequent description and the appended claims, taken in conjunction with the accompanying drawings.

BRIEF DESCRIPTION OF THE DRAWINGS

The present invention will hereinafter be described in conjunction with the appended drawing figures, wherein like numerals denote like elements, and.

DETAILED DESCRIPTION OF A PREFERRED EXEMPLARY EMBODIMENT

The following detailed description of a preferred embodiment is merely exemplary in nature and is not intended to limit the invention or the application and uses of the invention. Furthermore, there is no intention to be bound by any theory presented in the preceding background of the invention or the following detailed description of a preferred exemplary embodiment.

Figure 1:
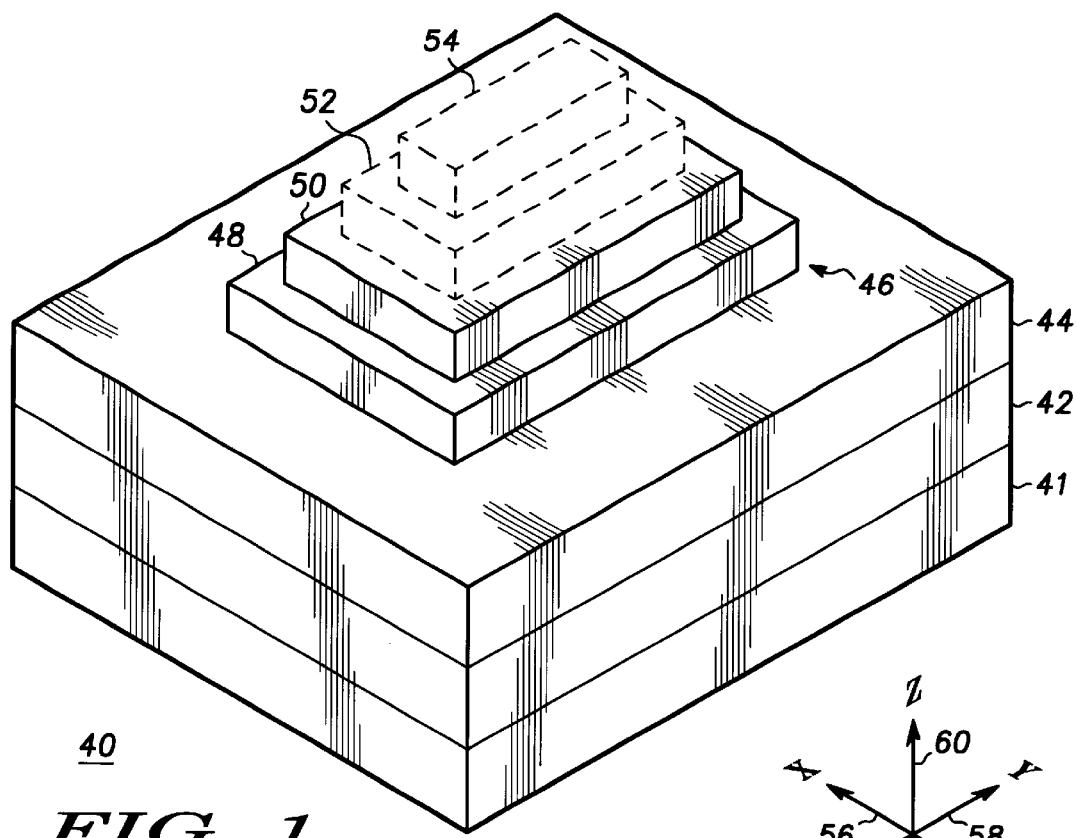
FIG. 1 is an enlarged perspective view of a magnetoelectronics element according to an exemplary embodiment of the present invention.

FIG. 1 illustrates a magnetoelectronics element 40 according to a preferred exemplary embodiment of the present invention. The magnetoelectronics element 40 is preferably a giant magneto resistance (GMR) element or a tunneling magneto resistance (TMR) element, having a first magnetic layer 42 on a substrate 41, a tunnel barrier layer 44 on the first magnetic layer 42, and a second magnetic layer 46 on the tunnel barrier layer 44.

The first and second magnetic layers (42,46), and any additional magnetic layers, can be formed of any number of magnetic materials, such as nickel, iron, copper, cobalt or alloys thereof. Alternatively, the first and second magnetic layers (42,46), and any additional magnetic layers, can be a composite magnetic material, such as nickel-iron-cobalt and cobalt-iron, for example. The tunnel barrier layer 44, and any additional tunnel barrier layers, is preferably aluminum oxide ($Al_2O_3$), but any number of insulators or semiconductors, such as aluminum nitride or oxides of nickel, iron, cobalt or alloys thereof, may be used in accordance with the present invention.

The second magnetic layer 46 of the magnetoelectronics element 40 is preferably formed of at least a first sub-element layer 48 magnetically coupled to a second sub-element layer 50. However, the second magnetic layer 46 may be formed of any number of sub-element layers, including, but not limited to, a third sub-element layer 52 and a fourth sub-element layer 54. In addition, while the following detailed description of a preferred exemplary embodiment will be described with respect to the formation of a second magnetic layer 46 with multiple sub-element layers, the first magnetic layer 42 or the tunnel barrier layer 44 may be formed of multiple sub-element layers or the first magnetic layer 42, tunnel barrier layer 44 and the second magnetic layer 46 may be formed of multiple sub-element layers. Furthermore, the magnetoelectronics element may include additional magnetic layers and tunnel barrier layers, and each of these additional magnetic layers or tunnel barrier layers may be a multiple sub-element layer.

The lateral and vertical dimensions of the first sub-element layer 48 and the second sub-element layer 50 may be characterized for convenience with a first coordinate axis, second coordinate axis and third coordinate axis, such as an x-coordinate axis 56, y-coordinate axis 58 and z-coordinate axis 60, respectively, and configured such that an equivalent volume of the second magnetic layer 46 is provided that preferably improves the operating characteristics of the second magnetic layer 46, and more preferably improves the operating characteristics of the magnetoelectronics element 40 while reducing the size of the magnetoelectronics element 40. For example, the second magnetic layer 46 may be configured such that the lateral dimensions of the second magnetic layer 46 (e.g., dimensions in the plane defined by the x-coordinate axis 56 and the y-coordinate 58 axis) are reduced. The smaller layer acts to provide a reduced and more uniform demagnetization field for the total bit, thereby inhibiting vortex formation and encouraging reversal via coherent vortex formation. This improved uniform demagnetization field is similar to the most preferred configuration of a three-dimensional ellipsoidal of revolution that is expected to display coherent rotation reversal. This combined two-layer structure also increases the magnetic volume to maintain a sufficient energy barrier for data retention.

Figure 2:
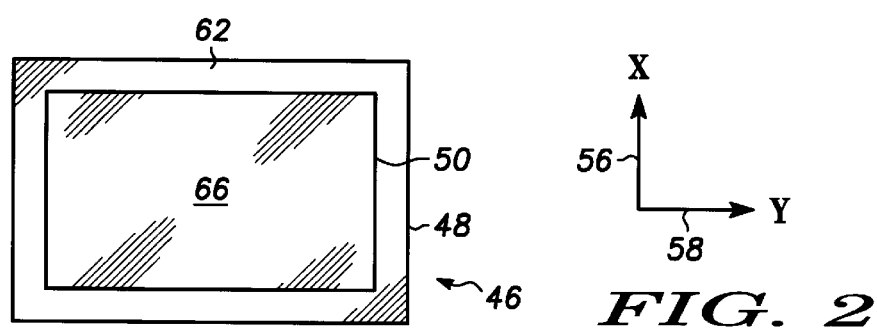
FIG. 2 is a top view of the second magnetic layer of FIG. 1 according to a second preferred exemplary embodiment of the present invention.
Figure 3:
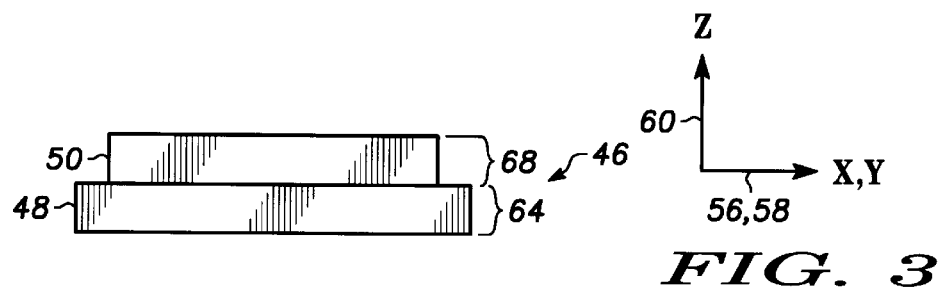
FIG. 3 is a side view of the second magnetic layer of FIG. 1 according to a preferred exemplary embodiment of the present invention.
Figure 4:
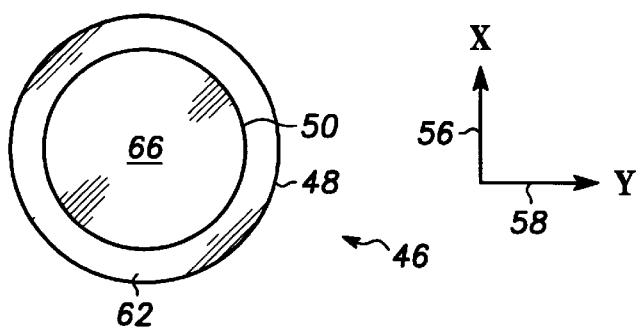
FIG. 4 is a top view of a second magnetic layer having a cylindrical shape according to a preferred exemplary embodiment of the present invention.
Figure 5:
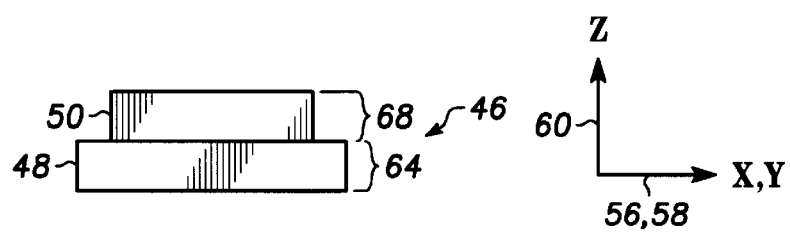
FIG. 5 is a side view of a second magnetic layer having a cylindrical shape according to a preferred exemplary embodiment of the present invention.

Referring to FIGS. 2 and 3, or alternatively to FIGS. 4 and 5, the first sub-element layer 48 and the second sub-element layer 50 of the second magnetic layer 46 are shown in greater detail. While the second magnetic layer 46 is shown for simplicity and clarity without sub-element layers other than the first sub-element layer 48 and the second sub-element layer 50, it should be understood that the present invention is not limited to two sub-element layers. Furthermore, while the first sub-element layer 48 and the second sub-element layer 50 are shown as having rectangular shapes in FIG. 2 and elliptical shapes in FIG. 4, the sub-element layers may be any number of geometrical shapes, including, but not limited to triangular, pentagonal, hexagonal, octagonal shapes, for example. In addition, while any number of processing techniques can be used to form the magnetoelectronics element having a magnetic layer formed of multiple sub-element layers, an example is provided in Appendix A for illustrative purposes.

The first sub-element layer 48 is preferably configured to have a first area 62 and a first thickness 64 that substantially define a first volume. The second magnetic layer 50, which is preferably coupled magnetically to the first sub-element layer 48, is configured to have a second area 66 and a second thickness 68 that substantially define a second volume. The second area 66 is formed to be less than the first area 62, and the first thickness 64 and the second thickness 68 are selected to provide an equivalent volume of the second magnetic layer 46.

For example, the first sub-element layer 46 may be configured to have the first area 62 in a first plane substantially defined by the x-coordinate axis 56 and y-coordinate axis 58 that is 0.045 $\mu m^2$, and the second sub-element layer 50 may be configured to have the second area 66 in a second plane substantially defined by the x-coordinate axis 56 and y-coordinate axis 58 that is 0.025 $\mu m^2$. Furthermore, a 60-Angstrom (x) thickness may be selected for the first thickness 64 in a direction substantially defined by the z-coordinate axis 60, and a 30×thickness may be selected for the second thickness 68 in the direction substantially defined by the z-coordinate axis 60. This provides for a first volume of the first sub-element layer 48 a second volume of the second sub-element 50 that produces a multiple sub-element structure that has an equivalent volume that is equal to the volume of a single sub-element structure with an area of 0.045 $\mu m^2$ and a thickness of 80.

A magnetoelectronics element that includes a multiple sub-element structure, or more than one of the multiple sub-element structures, provides numerous desirable features and characteristics. For example, the size of the magnetoelectronics element may be reduced in order to increase package density by decreasing the lateral dimensions and increasing the thickness of the element, while maintaining an equivalent volume of a magnetic layer that supplies a sufficient energy barrier to element switching. The thickness of each of the sub-elements of the magnetic layer may be increased to allow the reduction in lateral size, and the thickness is preferably increased until a flux-closing configuration is likely to exist. (See, R. P. Cowburn et al., *Physical Review Letters*, Volume 83, Number 5, pages 1042–1045, Aug. 2, 1999), which is hereby incorporated by reference). However, the thickness of each of the sub-elements of the magnetic layer may be also reduced to minimize potential vortex formation if additional sub-element layers are utilized in the formation of a magnetic layer.

Figure 6:
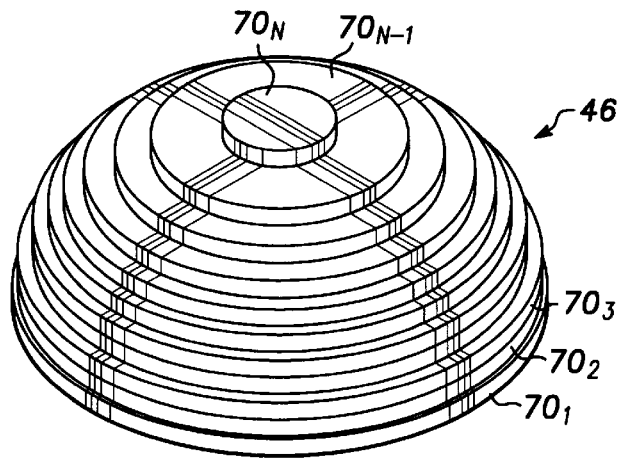
FIG. 6 i s a top view of a substantially integrated second magnetic layer according to a preferred exemplary embodiment of the present invention.
Figure 7:
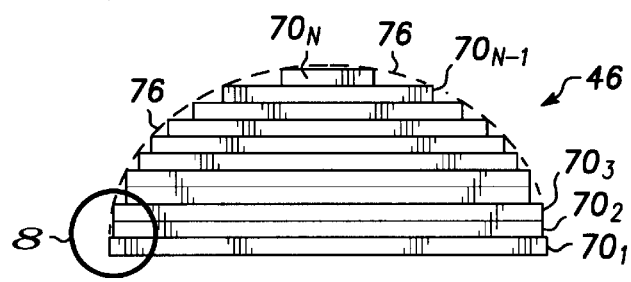
FIG. 7 is a side view of a substantially integrated second magnetic layer according to a preferred exemplary embodiment of the present invention.
Figure 8:
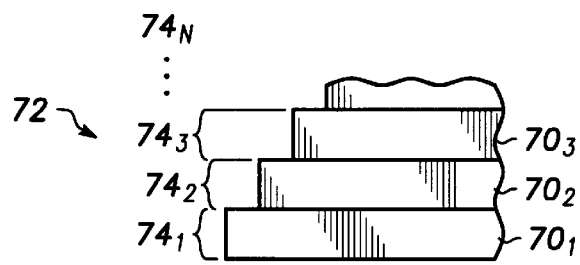
FIG. 8 is an enlarged view taken from circle 8 of FIG. 7.

Referring to FIGS. 6, 7, and 8, the second magnetic layer is shown having a first number (N) of sub-element layers 70 (i.e., $70_1$, $70_2$, $70_3$, ..., $70_{N-1}$, $70_N$) with a second number (M) of areas and a third number (P) of thicknesses, that provide an equivalent volume and an effective edge thickness, which preferably lowers the demagnetization effect at each sub-element layer edge, and preferably minimizes potential vortex formation. More specifically, and with particular reference to the enlarged view 72 of FIG. 6, the N sub-element layers 70 preferably have the P thicknesses 74 (i.e., $74_1$, $74_2$, $74_3$, ..., $74_{N-1}$, $74_N$) of M area that make up a fourth number (V) of volumes providing an equivalent volume of the second magnetic layer 46. This structure of N sub-element layers 70 forms a surface contour 76 of a predetermined shape, such as the ellipsoidal surface contour 76 shown in FIG. 7. Furthermore, the M thicknesess 74 (FIG. 8) may be decreased to a thickness that approaches zero, with the N sub-element layers 70 approaching infinity to provide the equivalent volume and a substantially integrated structure forming the surface contour. In this way, the thickness of the N sub-elements 70 are reduced to minimize potential vortex formation by increasing number of N sub-element layers, which may be used in any number of number of magnetoelectronics devices including an memory.

Figure 9:
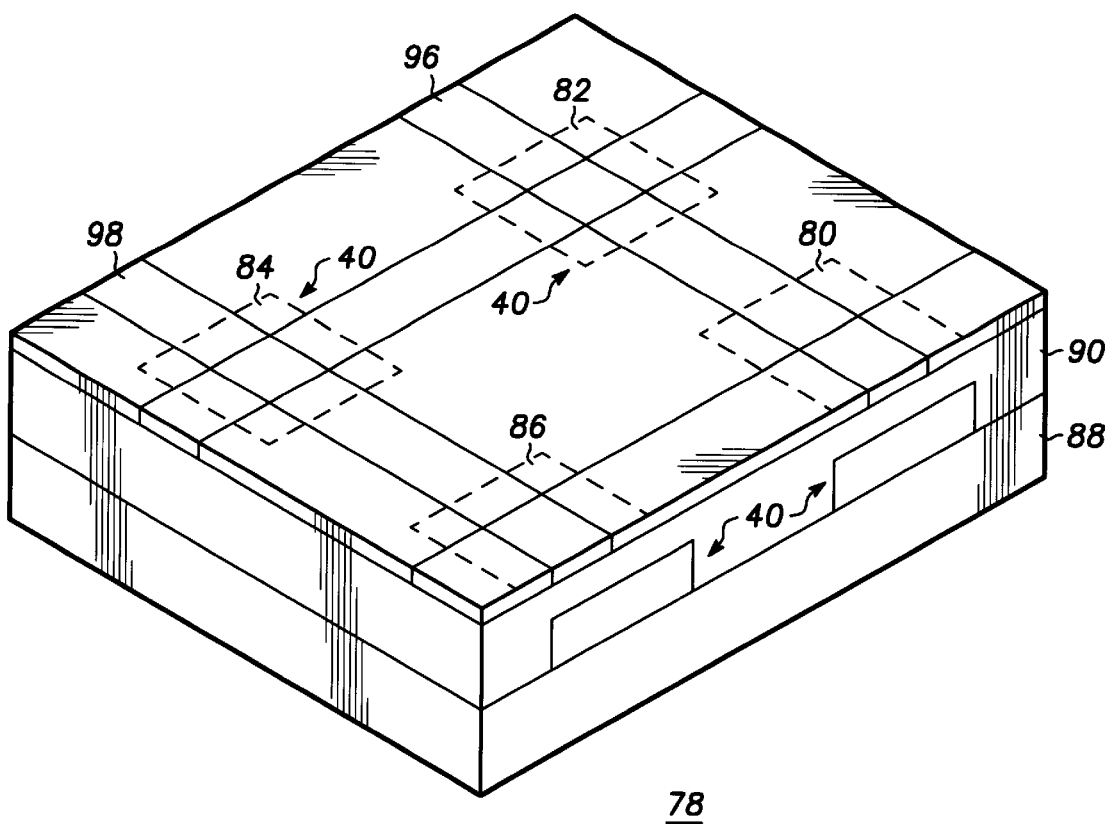
FIG. 9 is an enlarged perspective view of a memory utilizing the magnetoelectronics element of FIG. 1 according to a preferred exemplary embodiment of the invention.

FIG. 9 illustrates an enlarged perspective view of a portion of a memory 78 that uses the magnetoelectronics element 40 of FIG. 1 for memory cells of the memory 78. The memory 78 includes a plurality of memory cells including a first cell 80, a second cell 82, a third cell 84, and a fourth cell 86, indicated by dashed boxes. The memory 78 also includes a substrate 88, for example a semiconductor substrate, onto which the magnetoelectronics elements 40 form the multiple cells (80,82,84,86). The substrate 88 can also include other circuitry including sense amplifiers and digital circuitry.

A dielectric 90 is applied to cover the exposed portions of substrate 88 and each magnetoelectronics element 40 that is formed on the substrate 88. Typically, the cells (80,82,84,86) are formed on the substrate 88 with a space between each of the cells (82,84,86,88). Conductors are then applied to interconnect the magnetoelectronic elements 40 forming the cells (80,82,84,86) in individual rows. For example, a first conductor 92 is applied between the first cell 80 and the fourth cell 86 to form a first row or sense line, and a second conductor 94 is applied between second cell 22 and third cell 84 in order to form a second row or sense line. A plurality of transverse conductors or word lines are applied on the surface of dielectric 90 overlying the memory cells. A third conductor or first word line 96 overlays the magnetoelectronics element 40 of the first cell 80 and second cell 82, and a fourth conductor or second word line 98 overlays the magnetoelectronics element 40 of the third cell 84 and fourth cell 86. This configuration provides the basic structure for a spintronic memory device. As may be appreciated, this should not be understood as the only configuration as numerous arrangements and devices are available with the magnetoelectronics element 40.

From the foregoing description, it should be appreciated that a magnetoelectronics element is provided that presents significant benefits that have been presented and also benefits that would be apparent to one skilled in the art. Furthermore, while multiple embodiments have been presented in the foregoing description, it should be appreciated that a vast number of variations in the embodiments exist. Lastly, it should be appreciated that these embodiments are preferred exemplary embodiments only, and are not intended to limit the scope, applicability, or configuration of the invention in any way. Rather, the foregoing detailed description provides those skilled in the art with a convenient road map for implementing a preferred exemplary embodiment of the invention. It being understood that various changes may be made in the function and arrangement of elements described in the exemplary preferred embodiment without departing from the spirit and scope of the invention as set forth in the appended claims.

APPENDIX A

Self-Aligned "Side-Wall Spacer" Technique
for Manufacturing a Two Sub-Element Magnetic Layer 1) Deposit a full "bottomed-pinned" magnetic tunnel junction film on a suitable substrate. The top magnetic "free-layer" to be patterned can be composed of a multi-layered film such that there is a different material deposited to separate the sub-layer thicknesses. This layer will preferably act as an etch stop, allowing the top sub-layer to be patterned at a different size than the bottom. This layer most preferably provides full ferromagnetic exchange for the two sub-layers.
2) Deposit a "hard mask" layer on top of the stack. The thickness of this layer can be optimized to achieve the desired side-wall spacer thickness discussed in a subsequent step.
3) Photolithographically pattern the smaller top sub-layer and APPENDIX A-continued Self-Aligned "Side-Wall Spacer" Technique
for Manufacturing a Two Sub-Element Magnetic Layer etch to the etch stop.
4) Deposit another hard mask material on the top of the patterned wafer. The material will cover the smaller patterned sub-layer. The thickness of this mask layer can be optimized to give the desired side-wall thickness.
5) Anisotropically etch the mask layer until the field area is clear. This will leave residual hard-mask material as a side-wall spacer surrounding the small patterned sub-layer.
6) Etch the remaining magnetic material clear. The side-wall spacer acts as a mask to pattern the lower larger sub-layer.

What is claimed is:

1. A magnetic layer of a magnetoelectronics element, said magnetic layer comprising:
   a first sub-element layer having a first planar area;
   a second sub-element layer of a magnetic material adjacent said first sub-element layer, said second sub-element layer having a second planar area that is less than said first planar area; and
   wherein each of said planar areas resides in a plane defined by an X-coordinate axis and a Y-coordinate axis such that said magnetic layer forms a substantially continuous three-dimensional ellipsoidal structure.

2. The magnetic layer of claim 1, wherein said first sub-element layer has a first thickness and said second sub-element layer has a second thickness, said first thickness and said first planar area defining a first volume and said second thickness and said second planar area defining a second volume, and said first volume and said second volume providing a total volume of said magnetic layer.

3. The magnetic layer of claim 1, further comprising a third sub-element layer adjacent said second sub-element layer, said third sub-element layer having a third planar area that is less than said second planar area.

4. The magnetic layer of claim 3, wherein said first sub-element has a first thickness, said second sub-element layer has a second thickness and said third sub-element layer has a third thickness, said first thickness and said first planar area defining a first volume, said second thickness and said second planar area defining a second volume and said third thickness and said third planar area defining a third volume, and said first volume, said second volume and said third volume providing a volume of said magnetic layer.

5. A magnetoelectronics element, comprising:
   a first magnetic layer;
   a first tunnel barrier layer on said first magnetic layer;
   a second magnetic layer on said first tunnel barrier layer, said second magnetic layer comprising:
      a first sub-element layer formed of a magnetic material having a first planar area;
      a second sub-element layer formed of a magnetic material adjacent said first sub-element layer, said second sub-element layer having a second planar area that is less than said first planar area; and
   wherein each of said planar areas resides in a plane defined by an X-coordinate axis and a Y-coordinate axis such that said second magnetic layer forms a substantially continuous three-dimensional ellipsoidal structure.

6. The magnetoelectronics element of claim 5, further comprising a third sub-element layer adjacent said second sub-element layer, said third sub-element layer having a third planar area that is less than said second area.

7. A magnetoelectronics element, comprising:

a first magnetic layer;

a first tunnel barrier layer on said first magnetic layer;

a second magnetic layer on said first tunnel barrier layer, said second magnetic layer having N sub-element layers, where N is greater than or equal to 2, and each of said N sub-element layers, excluding a lowest sub-element layer, having a predetermined planar area that is less than the predetermined planar area of another one of said N sub-element layers; and wherein each of said N sub-element layers resides in a defined by an X-coordinate axis and a Y-coordinate axis such that said second magnetic layer forms a substantially continuous three-dimensional ellipsoidal structure.

8. A magnetoelectronics element, comprising:

a first magnetic layer;

a first tunnel barrier layer on said first magnetic layer;

a second magnetic layer on said first tunnel barrier layer, said second magnetic layer having N sub-element layers with predetermined planar areas, where N is greater than or equal to 2, wherein a predetermined planar area for an N−1 sub-element layer is less than a predetermined area for an N sub-element layer, excluding a lowest sub-element layer; and wherein each of said N sub-element layers resides in a plane defined by an X-coordinate axis and a Y-coordinate axis such that said second magnetic layer forms a substantially continuous three-dimensional ellipsoidal structure.

9. A magnetoelectronics element, comprising:

a first planar magnetic layer;

a first tunnel barrier layer on said first planar magnetic layer; and a second planar magnetic layer on said first tunnel barrier layer, said second planar magnetic layer comprising N magnetic sub-element layers having M predetermined thickness; and wherein each of said planar layers resides in a plane defined by an X-coordinate axis and a Y-coordinate axis such that said second magnetic layer forms a substantially continuous three-dimensional ellipsoidal structure.

10. A method of forming a magnetic layer of a magnetoelectronics element, said method comprising the steps of:

forming a first sub-element layer of a magnetic material having a first planar area;

forming a second sub-element layer of a magnetic material adjacent said first sub-element layer, said second sub-element layer having a second planar area that is less than said first planar area; and wherein each of said planar areas resides in a plane defined by an X-coordinate axis and a Y-coordinate axis such that said magnetic layer forms a substantially continuous three-dimensional ellipsoidal structure.

11. The method of claim 10, further comprising:

defining a first volume of said first sub-element layer with said first planar area and a first thickness;

defining a second volume of said second sub-element layer with said second planar area and a second thickness; and providing a total volume of said magnetic layer with said first volume and said second volume.

12. The method of claim 10, further comprising forming a third sub-element layer adjacent said second sub-element layer, said third sub-element layer having a third planar area that is less than said second area.

13. A memory, comprising:

a substrate;

a plurality of magnetoelectronics elements forming memory cells on said substrate, said plurality of magnetoelectronics elements comprising:

a first magnetic layer;

a tunnel barrier layer on said first magnetic layer;

a second magnetic layer on said tunnel barrier, said second magnetic layer comprising:

a first sub-element layer of a magnetic material having a first planar area; and a second sub-element layer of a magnetic material adjacent said first sub-element layer, said second sub-element layer having a second planar area that is less than said first area; and wherein each of said planar areas resides in a plane defined by an X-coordinate axis and a Y-coordinate axis such that said magnetic layer forms a substantially continuous three-dimensional ellipsoidal structure.

14. The memory of claim 13, wherein said first sub-element layer has a first thickness and said second sub-element layer has a second thickness, said first thickness and said first planar area defining a first volume and said second thickness and said second planar area defining a second volume, and said first volume and said second volume providing a total volume of said magnetic layer.

15. The memory of claim 14, further comprising a third sub-element layer adjacent said second sub-element layer, said third sub-element layer having a third planar area that is less than said second planar area.

16. The memory of claim 13, further comprising a dielectric at least covering a portion of said substrate and a portion of each of said plurality of magnetoelectronics elements.

17. The memory of claim 13, further comprising a first conductor overlaying a first magnetoelectronic element and a second magnetoelectronic element of said plurality of magnetoelectronic elements.

18. The memory of claim 17, further comprising a second conductor overlaying a third magnetoelectronic element and a forth magnetoelectronic element of said plurality of magnetoelectronic elements.

* * * * *

UNITED STATES PATENT AND TRADEMARK OFFICE
CERTIFICATE OF CORRECTION

PATENT NO. : 6,579,625 B1
DATED : June 17, 2003
INVENTOR(S) : Engel et al.

It is certified that error appears in the above-identified patent and that said Letters Patent is hereby corrected as shown below:

Column 1,
Line 4, please add as a new first paragraph the following paragraph:
-- This invention was made with Government support under Agreement No. MDA972-96-3-0016 awarded by DARPA. The Government has certain rights in the invention. --

Signed and Sealed this

Twenty-eighth Day of October, 2003

JAMES E. ROGAN
*Director of the United States Patent and Trademark Office*